(12) United States Patent
Bang

(10) Patent No.: US 11,287,437 B2
(45) Date of Patent: Mar. 29, 2022

(54) METHOD AND APPARATUS FOR IMPLEMENTING DRIVE SIGNAL FOR DRIVING RESOLVER SENSOR

(71) Applicant: HYUNDAI MOBIS CO., LTD., Seoul (KR)

(72) Inventor: Sung-Hoon Bang, Goyang-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 0 days.

(21) Appl. No.: 16/912,331

(22) Filed: Jun. 25, 2020

(65) Prior Publication Data

US 2021/0033636 A1    Feb. 4, 2021

(30) Foreign Application Priority Data

Jul. 30, 2019 (KR) .................. 10-2019-0092502

(51) Int. Cl.
| | |
|---|---|
| *H03K 21/00* | (2006.01) |
| *G01P 3/44* | (2006.01) |
| *G01D 5/20* | (2006.01) |
| *H03K 3/02* | (2006.01) |
| *H03K 5/01* | (2006.01) |
| *H03K 21/38* | (2006.01) |
| *H03K 21/40* | (2006.01) |

(52) U.S. Cl.
CPC ............... *G01P 3/44* (2013.01); *G01D 5/204* (2013.01); *H03K 3/02* (2013.01); *H03K 5/01* (2013.01); *H03K 21/38* (2013.01); *H03K 21/40* (2013.01)

(58) Field of Classification Search
None
See application file for complete search history.

(56) References Cited

U.S. PATENT DOCUMENTS

| | | | | |
|---|---|---|---|---|
| 3,500,213 A | * | 3/1970 | Albert ................ | H04L 27/122 327/107 |
| 3,641,566 A | * | 2/1972 | Konrad ................ | H03M 1/00 341/147 |
| 3,657,657 A | * | 4/1972 | Jefferson ............. | G06G 7/28 327/117 |
| 3,713,137 A | * | 1/1973 | Stone ................... | G06J 1/00 341/127 |

(Continued)

FOREIGN PATENT DOCUMENTS

| | | |
|---|---|---|
| DE | 102013226850 A1 | 6/2015 |
| DE | 102019203612 | 9/2019 |

(Continued)

OTHER PUBLICATIONS

German Office Action for German Application No. 10 2020 208 030.5 dated Feb. 11, 2021 (10 pgs).

*Primary Examiner* — Tuan T Lam (74) *Attorney, Agent, or Firm* — Morgan, Lewis & Bockius LLP (57) ABSTRACT

A method and apparatus for generating a drive signal for driving a resolver sensor are provided. The method and apparatus implement a drive signal to be input to a resolver sensor. The method and apparatus perform counting in association with an incoming square wave signal and implement a drive signal after confirming that a specific point corresponding to a preset condition of the incoming square wave signal arrives.

10 Claims, 5 Drawing Sheets

(56) References Cited

U.S. PATENT DOCUMENTS

| | | | | |
|---|---|---|---|---|
| 3,778,814 | A * | 12/1973 | Dildy, Jr. ............... | H03K 4/026 341/147 |
| 4,368,432 | A * | 1/1983 | Levy .................... | H04M 1/505 327/107 |
| 4,524,326 | A * | 6/1985 | Larson .................. | G06J 1/00 327/105 |
| 4,710,770 | A * | 12/1987 | Hakata ................. | H03M 1/645 340/870.18 |
| 5,054,039 | A * | 10/1991 | Blackmon .............. | G01H 3/005 377/42 |
| 5,459,148 | A * | 10/1995 | Yanagisawa ........ | C07D 213/80 514/303 |
| 5,504,445 | A * | 4/1996 | Miki ....................... | H03K 4/02 327/106 |
| 2019/0288619 | A1 * | 9/2019 | Bang ..................... | G06F 1/04 |

FOREIGN PATENT DOCUMENTS

| | | | |
|---|---|---|---|
| JP | 2013137258 | A | 7/2013 |
| KR | 1985-0000192 | A | 10/1985 |
| KR | 1988-0014720 | A | 5/1987 |
| KR | 10-0936290 | B1 | 1/2010 |
| KR | 10-1338707 | B | 12/2013 |
| KR | 10-1406081 | B1 | 6/2014 |
| KR | 2015-0020553 | A | 2/2015 |

* cited by examiner

FIG.5

METHOD AND APPARATUS FOR IMPLEMENTING DRIVE SIGNAL FOR DRIVING RESOLVER SENSOR

CROSS-REFERENCE TO RELATED APPLICATION

The present application claims priority to and the benefit of Korean Patent Application No. 10-2019-0092502, filed Jul. 30, 2019, which is incorporated herein for all purposes by this reference.

TECHNICAL FIELD

The present disclosure relates to a method and apparatus for implementing a drive signal for driving a resolver sensor. More particularly, the present disclosure relates to a method and apparatus for implementing a drive signal for driving a resolver sensor, the drive signal having an ideal sine waveform.

BACKGROUND

The statements in this section merely provide background information related to the present disclosure and may not constitute prior art.

A resolver sensor refers to a sensor for measuring the angular position of a rotor of a motor. Since resolver sensors have a higher mechanical strength and durability than encoders, they are used as position sensors for motors in applications, such as automobiles, where high performance and high precision driving are required. Resolvers are used to measure the angle of rotation of a rotating device such as a motor or an engine. In applications such as motor driven-systems that require frequent speed changes or precise position control, a resolver sensor is used to detect a rotor position.

The resolver is an analog angle detection sensor that converts a mechanical angular displacement of a motor into an electrical signal using an electromagnetic induction phenomenon. The resolver sensor receives a drive signal to be described below in detail, modulates the drive signal with a stator coil, and produces a reflected excitation signal (sine wave signal and/or cosine wave signal).

To perform precise position control using the resolver sensor, it is necessary to implement an ideal sine waveform signal as a drive signal to be input to the resolver sensor. However, a drive signal created according to the related art is far from an ideal sine waveform signal due to signal loss, signal distortion, etc., which inevitably occur in a filtering process. Therefore, the drive control of the resolver sensor may be imprecise and inaccurate. Furthermore, the driving on a road may be dependent on the frequency of a drive signal due to the characteristics of a push-pull signal. In addition, in the case where a duty ratio of 50% for a square wave signal is not guaranteed, a large signal distortion may occur. When a distorted drive signal is input to a resolver sensor, an error may be introduced into an output value of the resolver sensor. Moreover, an internal circuit may be modified to change the operating voltage.

The present disclosure aims at implementing an ideal sine waveform signal as a drive signal for driving a resolver sensor.

SUMMARY

The present disclosure provides a method and apparatus for implementing a high-quality drive signal to be input to a resolver sensor.

The present disclosure also provides a method and apparatus that are configured to count time in association with an incoming square wave signal using an internal counter. Thus, in a case where a specific event (rising pulse or edge) of the square wave signal occurs at a first time point and then the same specific event occurs again at a second time point, the method and apparatus generate a drive signal at the second time point. In this way, the method and apparatus can delay the generation of the drive signal from the reception of the square wave signal by as much as one cycle of the square wave signal.

In one aspect, there is provided a method of generating a drive signal for driving a resolver sensor, the method including: (a) receiving a square wave signal; (b) starting counting up at a time point corresponding to a specific point of the square wave signal; and (c) when a next specific point corresponding to a preset condition of the square wave signal arrives, performing control for generating the drive signal, initializing a count value to zero, and restarting counting up.

In the method, the step (b) and the step (c) are repeatedly performed.

The specific point may correspond to a rising pulse or edge of the square wave signal, and the next specific point may correspond to the next rising pulse or edge of the square wave signal.

In the method, a period from the specific point to the next specific point may be equal to one cycle of the square wave signal.

The method further includes a step of increasing or decreasing the magnitude of the drive signal.

In the method, in the step (c), when the next specific point corresponding to the preset condition does not arrive within a predetermined period of time, the drive signal generation apparatus may stop the control for generating the drive signal.

In the method, the drive signal generated in the step (c) may be matched with the square wave signal counted in the step (b).

In the method, in the step (b), the specific point may correspond to the first rising pulse or edge of the square wave signal and the next specific point may correspond to the second rising pulse or edge of the square wave signal.

In the method, the step (c) further includes a step of generating an enable signal for initiating the generation of the drive signal. The enable signal is activated at a time point corresponding to the next specific point and the activated state is maintained within the predetermined period of time.

According to another aspect of the present disclosure, there is provided an apparatus for implementing a drive signal for driving a resolver sensor, the apparatus including: a signal receiver configured to receive a square wave signal; a counter configured to start counting at a time point corresponding to a specific point of the square wave signal, to continue counting until a next specific point corresponding to a preset condition of the square wave signal arrives, to initialize a count value to zero when the next specific point arrives, and to restart counting; and a signal generator controlled to implement the drive signal.

According to a further aspect of the present disclosure, there is provided a computer-readable recording medium containing computer instructions to execute a drive signal generation method in conjunction with a computing device, the method comprising: (a) receiving a square wave signal; (b) starting counting when a specific point of the square wave signal arrives; and (c) when a next specific point corresponding to a preset condition of the square wave signal arrives, performing control for implementing the drive signal, initializing a count value to zero, and restarting counting.

According to the present disclosure, it is possible to implement an ideal sine waveform signal as a drive signal to be input to a resolver sensor.

According to the present disclosure, when the drive signal is generated at every rising edge of a square wave signal, at least 50% duty ratio can be ensured. Thus, a high-quality sine wave signal can be generated.

According to the present disclosure, it is possible to check abnormality in the frequency of the square wave signal.

According to the present disclosure, it is possible to easily adjust the magnitude (i.e., voltage) of the drive signal.

According to the present disclosure, it is possible to prevent the drive signal from being distorted due to environmental factors such as outdoor temperature.

According to the present disclosure, since it is possible to determine the period of a signal with the help of an internal counter, it is possible to internally control the frequency of the drive signal.

According to the present disclosure, since a monitoring time corresponding to one cycle of a square wave signal is secured, it is possible to check whether an abnormal signal is input, thereby preventing a resolver from operating with an abnormal drive signal.

The effects, features, and advantages of the present disclosure are not limited to the ones mentioned above, and other effects, features, and advantages not mentioned above can be clearly understood by the ordinarily skilled in the art from the following description.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Unless the context clearly defines otherwise, all terms or words (including technical and scientific terms or words) used herein have the same meanings as common meanings understood by those skilled in the art to which the present disclosure pertains.

Terms defined in commonly used dictionaries should not be interpreted overly ideally unless the context clearly defines otherwise. The terminology used herein is for describing some forms of the present disclosure and is not intended to limit the present disclosure. As used herein, the singular forms "a", "an", and "the" are intended to include the plural forms as well, unless the context clearly indicates otherwise.

It will be further understood that the terms "comprises" and/or "comprising" when used in this specification specify the presence of stated features, regions, integers, steps, operations, elements and/or components, but do not preclude the presence or addition of one or more other element, regions, integers, steps, operations, elements, components and/or groups thereof.

Hereinafter, some forms of the present disclosure will be described in detail with reference to the accompanying drawings.

Figure 1:
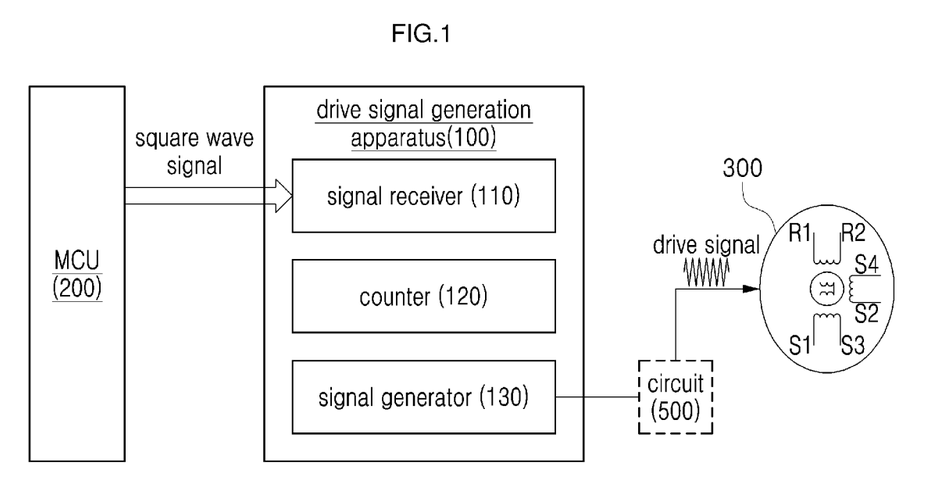
FIG. 1 is a diagram illustrating the construction of a drive signal generation apparatus in one form of the present disclosure.

FIG. 1 is a diagram illustrating the construction of a drive signal generation apparatus 100 in one form of the present disclosure.

Referring to FIG. 1, the drive signal generation apparatus 100 is largely composed of a signal receiver 110, a counter 120, and a signal generator 130. The apparatus 100 may further include additional components.

The signal receiver 110, the counter 120, and the signal generator 130 are separately named for the purpose of distinguishing the functions performed thereby. In some cases, one of these constituent elements may perform the function of another, or all these constituent elements performing those functions may be implemented as an integrated module.

Each of the constituent elements of the drive signal generation apparatus 100 will be described in detail below.

The signal receiver 110 receives square waves from an external device. The term "external device" means any kind of device that can generate a signal using a logic circuit. Preferably, the signal receiver 110 receives square waves from a micro controller unit (MCU) 200.

The MCU 200 controls the overall operation of the entire system including a resolver sensor 300 and the drive signal generation apparatus 100. Although not illustrated in the drawings, the MCU 200 may include a square wave generator, an analog-to-digital converter (ADC), and an operation unit. The square wave generator generates a square wave signal to serve as a control signal, and the analog-to-digital converter (ADC) converts analog signals received from the resolver sensor 300 into a digital signal. The operation unit receives various types of information provided by the resolver sensor and calculates a signal compensation value corresponding to a signal delay value.

Herein above, the MCU that provides square waves to the signal receiver 110 has been described.

A counter generally refers to a configuration that continuously counts up or down in association with an input signal when any input signal is present. In some forms of the present disclosure, the counter 120 primarily functions to count up in association with a square wave signal received by the signal receiver 110. Regarding the counting function performed by the counter 120, the counting starts at a specific time point related to a specific point (specific event or specific condition) of a square wave signal and continues until reaching the next time point related to the next specific point (specific event or specific condition) of the square wave signal. At the next time point, the counter initializes its count value to zero and starts counting again.

More specifically, the counter 120 starts a new count-up session every time a new cycle of a square wave signal arrives. In particular, the counting starts at a time point when a specific event occurs in the incoming cycle of the square wave signal. For example, the counting starts when a rising pulse (or rising edge) of the square wave signal is detected, and the next counting starts from a count value of zero when the next rising pulse (or next rising edge) of the square wave signal is detected. In this manner, with the help of the counter, it is possible to identify a specific time point where a specific event occurs in the square wave signal or a specific condition (for example, a rising pulse in some forms of the present disclosure) is satisfied.

The condition serving as the criterion for the counter 120 to start counting or the condition as the criterion for initializing the count value and then restarting counting is set by the designer of the drive signal generation apparatus 100 or the person who is in charge of control of the drive signal generation apparatus 100. Preferably, the condition refers to a state where the square wave signal has a specific signal value. For example, the condition may refer to a rising pulse (rising edge) or a falling pulse (edge) of a square wave.

The counter 120 starts counting at an arbitrary time, for example, a time point corresponding to a rising pulse (or edge) of a square wave signal and initializes the count value at a time point corresponding to the next rising pulse (or edge) of the square wave signal. However, when the next rising pulse (or edge) is detected within a predetermined time period from the beginning of the ongoing counting, the counter 120 initializes the count value and stops counting.

The signal generator 130 is configured to output a drive signal for driving the resolver sensor at the next time point where the counter initializes the count value to zero and starts counting again. The drive signal is a sine wave signal.

The drive signal generated by the signal generator 130 may be a sine wave signal with a fixed frequency. The signal generator 130 also functions as a square wave-to-sign wave converter, thereby converting a square wave signal received from the MCU 200 to a sine wave signal that serves as the drive signal. It is noted that the drive signal is a collective term referring to a signal applied to the resolver sensor. There may be other terms having the same meaning, for example, a stimulation signal, an excitation signal, etc. However, in the detailed description herein, such a signal will be referred to as drive signal.

It is particularly noted that the signal generator 130 can output a signal corresponding to a fraction of one cycle of a sine wave signal with the help of the counter 120. That is, it is assumed that a sinusoidal cycle (i.e., one cycle of a sine wave signal) can be divided into four fractions: a first fraction from 0 degrees to 90 degrees; a second fraction of 90 degrees to 180 degrees; a third fraction of 180 degrees to 270 degrees; and a fourth fraction of 270 degrees to 360 degrees depending on the phase. In this case, the signal generator 130 can output one of the four fractions of a sinusoidal cycle or a complete sinusoidal cycle whenever the counter 120 hits a specific count value. The expression "the counter 120 hits a specific count value" means that the number of counts counted by the counter 120 reaches a predetermined value when a portion of a square wave signal, which satisfies a specific condition, is detected.

For example, it is assumed that counting starts when the first rising pulse of a square wave signal is detected, and then the second, third, and fourth, and fifth rising pulses are sequentially detected at time intervals. The counter counts time between each rising pulse and the following rising pulse. In this case, the signal generator 130 can output a signal corresponding to the first fraction of a sine wave cycle in line with the second rising pulse of the square wave signal and a signal corresponding to the second fraction of a sine wave cycle in line with the third rising pulse of the square wave signal. In this manner, the third fraction and the fourth fraction of a sine wave cycle may be sequentially output in line with the respective rising pulses of the square wave signal. Alternatively, the signal generator 130 may output a complete cycle of a sinusoidal wave each time that the rising pulse of the square wave signal is detected.

As described above, the signal generator 130 implements a sinusoidal drive signal to be input to the resolver sensor 300 according to the count value output from the counter 120. The operation in which the signal generator 130 implements a sinusoidal drive signal in conjunction with the counter 120 has the following advantages: preventing generation of a distorted drive signal attributable to an abnormal an input signal because there is a time interval between the reception of the input signal and the generation of the drive signal; dramatically reducing distortions in a drive signals by operating in conjunction with the counter 120 for each phase of a sine wave signal; and generating a high-quality sine wave signal with at least 50% duty ratio by generating a sine wave signal by simply detecting rising pulses (or edges) of a square wave signal.

Herein above, the detailed construction of the drive signal generation apparatus 100 has been described with reference to FIG. 1.

Those skilled in the art will appreciate that the drive signal generation apparatus 100 further includes other components such as a communication unit, in addition to the signal receiver 110, the counter 120, and the signal generator 130. The communication unit may transmit information according to a serial peripheral interface (SPI) communication scheme. However, the communication scheme used by the communication unit may not be limited thereto. The drive signal that is output from the signal generator 130 may be directly input to the resolver sensor 300 or may be indirectly transmitted to the resolver sensor 300 via another circuit 500.

Figure 2:
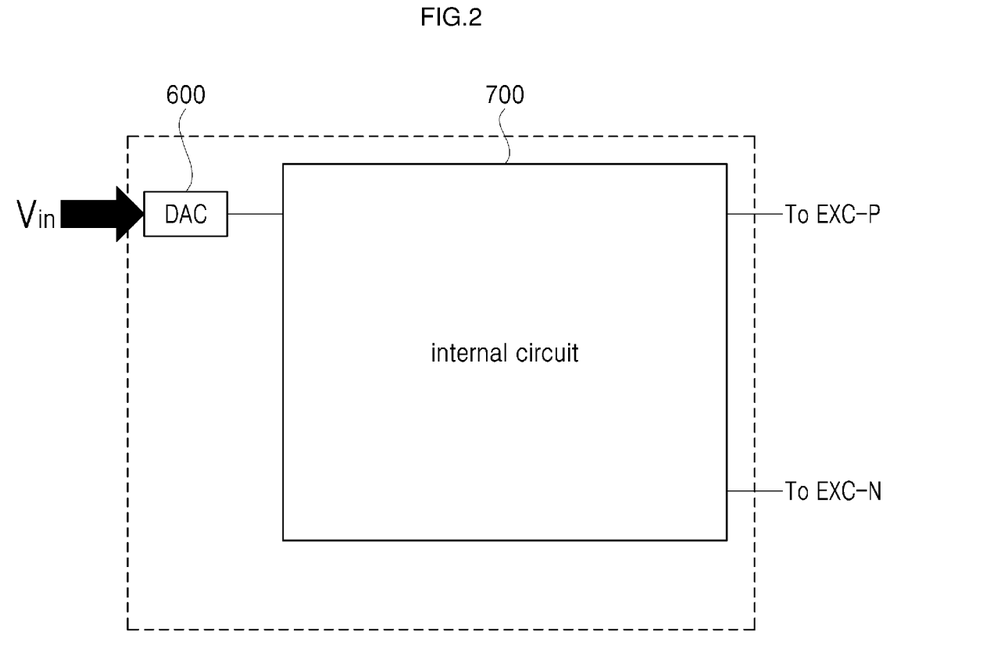
FIGS. 2 and 3 are diagrams illustrating the drive signal generation apparatus in one form of the present disclosure.
Figure 3:
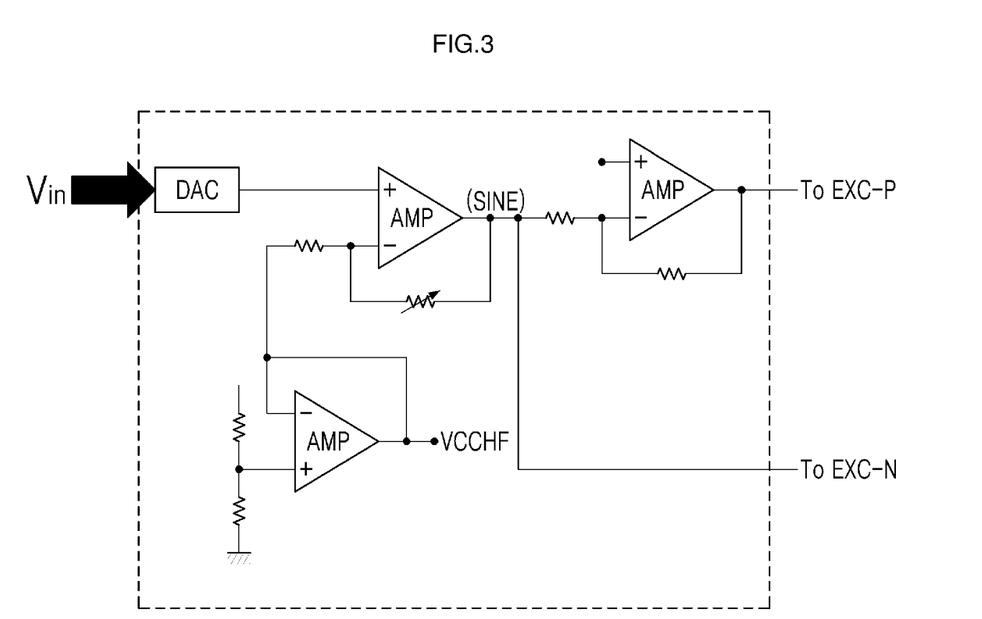

FIGS. 2 and 3 illustrate an actual implementation example of the drive signal generation apparatus 100 in some forms of the present disclosure. Referring to FIG. 2, the drive signal generation apparatus 100 is implemented as a digital-to-analog converter (DAC) 600. The DAC 600 receives a square wave signal Vin from an external device, inputs the square wave signal to an internal circuit 700, and outputs a sinusoidal drive signal. FIG. 3 illustrates a more specific form of FIG. 2. That is, FIG. 3 illustrates a detailed construction of the internal circuit 700. Referring to FIG. 3, the internal circuit 700 is composed of active elements such as an operational amplifier and passive elements such as a resistor. The construction of the internal circuit 700 illustrated in FIG. 3 is provided only for illustrative purposes. The detailed construction of the internal circuit that converts a square wave signal to a drive signal to be input to the resolver sensor 300 may diversely vary.

Figure 4:
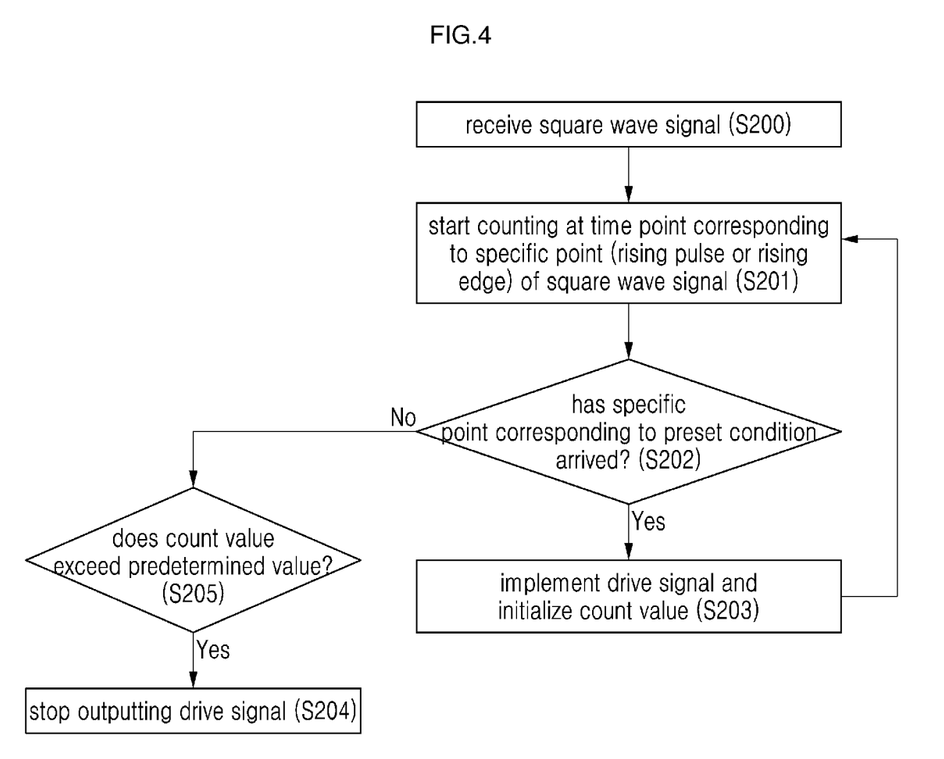
FIG. 4 is a flowchart illustrating a method of implementing a drive signal for driving a resolver sensor, in one form of the present disclosure.

FIG. 4 is a flowchart illustrating a method of implementing a drive signal for driving a resolver sensor 300. FIG. 4 shows a preferable sequence of steps. However, some steps may be eliminated from the flowchart or other some steps may be added to the flowchart if the elimination or the addition of the steps do not depart from the spirit of the present disclosure.

Steps to be described below are actually performed by the constituent elements of the drive signal generation apparatus 100. However, for convenience of description, it will be described in a manner that the drive signal generation apparatus 100 performs the steps herein below.

Referring to FIG. 4, in the method of implementing a drive signal, the first step is to receive a square wave signal (S201). In this step, the drive signal generation apparatus receives a square wave signal from a micro controller unit (MCU) 200. Since the functions and hardware features of the MCU 200 are described above, a detailed description of the MCU 200 will be omitted here.

After Step S200, the drive signal generation apparatus 100 starts counting up at a specific time point (S201). The specific time point is set by the user or the designer of the drive signal generation apparatus. For example, the specific time point may be a time point where the first rising pulse or the first rising edge of a square wave signal is detected. The term "first rising" means the rising that is detected very first time after the square wave signal is input to the apparatus. In addition, in a case where the square wave signal is input to the apparatus, the inputting of the square wave signal is then paused for a certain period, and then the inputting of the square wave signal is restarted, the rising that is detected first time after the inputting of the square wave signal is restarted can also be referred to as the first rising.

After Step S201, the drive signal generation apparatus 100 determines whether the next point corresponding to the preset condition has arrived (S202). When it is determined that the next point has arrived, the drive signal generation apparatus 100 performs control for implementing a sinusoidal drive signal and initializes the count value of the counter (S203). In contrast to Step S201 in which counting starts when the first rising edge is detected, in step S202, it is determined whether the next rising edge is detected after the starting of the counting. That is, it is determined whether the next point has arrived. When it is determined that the next point has arrived from the fact the next rising edge is detected, the drive signal generation apparatus performs control for implementing the drive signal and initializing the count value of the counter.

On the other hand, after the count value is initialized in Step S203, the drive signal generation apparatus 100 may return to Step S201 to repeat the same process. This is performed when the square wave signal is continuously input without interruption.

On the other hand, when the next point corresponding to the present condition does not arrive in Step S202, that is, when the next rising edge of the square wave signal is not detected in Step S202, the drive signal generation apparatus 100 stops the control for implementing the drive signal (S204). In other words, in Step S202, the determination that the next point does not arrive means that a specific portion of a square wave signal, which satisfies the condition preset by the user or the designer of the drive signal generation apparatus, is not detected for some reason (for example, the reception of the square wave signal is interrupted, or the signal intensity of the received square wave signal is insufficient to be detected due to the distortion of the signal, etc.). The case where the reception of the square wave signal is interrupted means that the square wave signal cannot be generated by the signal source or the quality of the generated square wave signal is not good enough to be input to the resolver sensor. Therefore, in this case, the drive signal generation apparatus in some forms of the present disclosure does not generate a drive signal.

On the other hand, when it is determined that the next point does not arrive in Step S202, the drive signal generation apparatus 100 in some forms of the present disclosure counts time (S205), and stops its operation when the counted time exceeds a predetermined wait time. For example, when the rising edge of the square wave signal is not detected within the predetermined wait time, the drive signal generation apparatus 100 stops the control for generating a sinusoidal drive signal.

The drive signal generation method in some forms of the present disclosure has been described above with reference to FIG. 4. Hereinafter, with reference to FIG. 5, each step of the drive signal generation method will be described again with reference to an actually received square wave signal and an actually generated sinusoidal drive signal.

Figure 5:
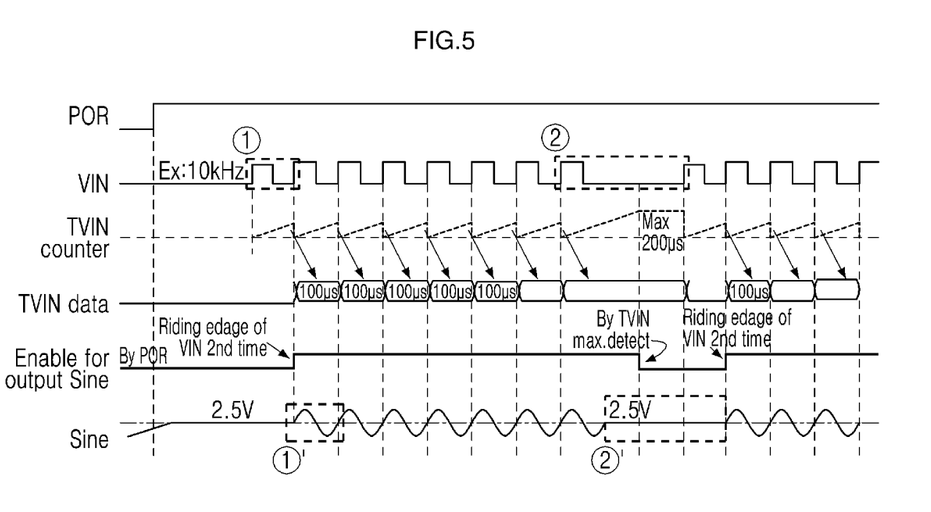
FIG. 5 is a diagram illustrating a test example for a drive signal generation method in one form of the present disclosure.

Referring to FIG. 5, the drive signal generation apparatus 100 receives a square wave signal denoted by VIN, and this receiving step corresponds to Step S200. For reference, in some forms of the present disclosure, it is assumed that the received square wave signal has a frequency of 10 kHz.

On the premise that the square wave signal according to Step S200 is received, in the drive signal generation apparatus 100, the internal counter starts counting at a time point when a specific point (for example, first rising edge) of the square wave signal arrives. In the graphical representation of FIG. 5, the clocks created by the internal counter is designated by "TVIN counter". This process corresponds to Step S201.

On the other hand, in the case where the first rising edge of the square wave signal VIN is detected in the apparatus, counting starts at this time point. When the next rising edge (second rising edge) arrives, a drive signal (i.e., sine wave signal) is generated. At this time point, the count value "TVIN counter" is initialized to zero, and then the counting starts again. This process corresponds to Step S203.

In FIG. 5, each complete cycle of the sine wave signal is contrasted with a corresponding complete cycle of the square wave signal VIN in which the sine wave originates. First two red rectangles ① and ①' indicate the first cycle of the square wave signal and the first cycle of the sine wave signal, respectively. As described above with reference to FIGS. 1 and 4, in some forms of the present disclosure, when a predetermined point of the first cycle of the square wave signal is detected and the corresponding point of the next cycle of the square wave signal arrives at the apparatus, the control for implementing a sinusoidal drive signal is started. As can be seen from FIG. 5, when the rising edge of the second cycle of the square wave signal is detected, the first cycle of the sinusoidal drive signal is generated. In this way, in the case of generating a sine wave signal at a certain time interval from receiving a square wave signal, it is possible to prevent a sine wave signal from being generated when receiving an abnormal waveform of a square wave. Thus, it is possible to prevent a distorted sine wave signal from being generated.

Referring to FIG. 5, when multiple cycles of a square wave signal are continuously input and count values corresponding to the respective cycles are obtained, the drive signal generation apparatus 100 performs the control for generating a cycle of a sine wave signal each time the rising edge of a cycle of square wave is detected. Therefore, it is possible to generate a drive signal having an ideal sine waveform. In addition, although not shown in FIG. 5, the drive signal generation apparatus 100 can freely set a specific time point at which a sine wave signal is to be generated, by using the internal counter. In addition, the period of one cycle of a sine wave also can be freely set with the help of the internal counter by the user or the designer of the apparatus. In addition, although not illustrated in FIG. 5, it should be noted that the drive signal generation apparatus 100 according to the present disclosure can freely adjust the magnitude of the sinusoidal drive signal. This point is described above with reference to FIG. 1.

Referring back to FIG. 5, the signal state in a red box designated by ② indicates that the reception of the square wave signal is abruptly stopped. When looking at the count value "TVIN counter" corresponding to the signal portion in the red box ②, the count value starts increasing at the time point corresponding to the rising edge of the signal portion in the red box ② and continuously increases up to a preset maximum count value because the rising edge of the next cycle of the square wave signal has still not arrived. After reaching the maximum count value, the count does not increase any more although the time elapses. The sine wave corresponding to the signal portion in the red box ② is also red-boxed and designated by ②'. From this representation, it is possible to know that when an abnormal square wave signal is received, the drive signal generation apparatus 100 does not generate a sine wave signal until a normal square wave is detected.

Meanwhile, an enable signal may be utilized in the process of implementing a sinusoidal drive signal in conjunction with the internal counter. That is, the drive signal generation apparatus 100 in some forms of the present disclosure activates the enable signal each time the rising edge of the square wave signal is detected when the square wave signal has a normal waveform. However, when an abnormal waveform is received, the enable signal is deactivated. In this way, by using the enable signal, it is possible to more clearly distinguish an event in which a normal sinusoidal drive signal is generated and an event in which a normal sinusoidal drive signal cannot be generated. Referring to FIG. 5, the enable signal is designated by "Enable for output Sine". The enable signal is activated when the rising edge of the square wave signal VIN is detected. On the other hand, the enable signal is deactivated if the rising edge of the square wave signal VIN is not detected within a predetermined period of time.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of implementing a drive signal for driving a resolver sensor, the method comprising:
   receiving a square wave signal;
   starting counting at a time point corresponding to a specific point of the square wave signal; and
   when a next specific point corresponding to a preset condition of the square wave signal arrives, starting to perform control for implementing the drive signal in line with the next specific point, initializing a count value to zero, and restarting counting.

2. The method according to claim 1, wherein the method further comprises:
   after performing the control, receiving the square wave signal; and
   starting counting at the time point corresponding to the specific point of the square wave signal.

3. The method according to claim 2, wherein the specific point corresponds to a rising pulse or edge of the square wave signal and the next specific point corresponds to a following rising pulse or edge of the square wave signal.

4. The method according to claim 2, wherein a period from the specific point to the next specific point is coincident with one cycle of the square wave signal.

5. The method according to claim 2, wherein the method further comprises:
   increasing or decreasing the magnitude of the drive signal.

6. The method according to claim 2, wherein performing the control comprises:
   when the next specific point corresponding to the preset condition does not arrive within a predetermined period of time, stopping the control for implementing the drive signal.

7. The method according to claim 2, wherein the specific point corresponds to the first rising pulse or edge of the square wave signal, and the next specific point corresponds to the second rising pulse or edge of the square wave signal.

8. The method according to claim 2, wherein performing the control comprises:
   generating an enable signal to initiate generation of the drive signal; and
   when the count value falls within a predetermined period of time after the next specific point arrives, activating the enable signal.

9. An apparatus for implementing a drive signal for driving a resolver sensor, the apparatus comprising:
   a signal receiver configured to receive a square wave signal;
   a counter configured to:
      start counting at a time point corresponding to a specific point of the square wave signal;
      continue the counting until a next specific point corresponding to a preset condition of the square wave signal arrives;
      initialize a count value to zero when the next specific point of the square wave signal arrives; and
      restart counting; and
   a signal generator configured to start implementing the drive signal when the next specific point arrives.

10. A non-transitory computer-readable recording medium having a program recorded thereon, the program to direct a processor to perform acts of:
   receiving a square wave signal; starting counting at a time point corresponding to a specific point of the square wave signal; and
   when a next specific point corresponding to a preset condition of the square wave signal arrives, starting to perform control to implement a drive signal at a time point corresponding to the next specific point, initializing a count value to zero, and restarting counting.

* * * * *